United States Patent [19]

Raganitsch

[11] Patent Number: 5,152,225
[45] Date of Patent: Oct. 6, 1992

[54] METHOD OF MAKING A PRINTING FILM AND PRINTING PROCESS USING SAME

[75] Inventor: Josef Raganitsch, Vienna, Austria

[73] Assignee: Raganitsch Gesellschaft mbH, Vienna, Austria

[21] Appl. No.: 629,264

[22] Filed: Dec. 18, 1990

[30] Foreign Application Priority Data

Dec. 20, 1989 [AT] Austria ................................ 2896/89

[51] Int. Cl.⁵ ............................. B41C 1/00; B41C 1/10
[52] U.S. Cl. .................................. 101/467; 101/401.1; 430/302; 430/945
[58] Field of Search .................. 101/467, 450.1, 451, 101/452, 211, 401.1; 346/135.1, 76 L; 430/302, 945

[56] References Cited

U.S. PATENT DOCUMENTS 4,063,949 12/1977 Uhlig et al. .................... 101/467 X
4,587,209 5/1986 Ohno et al. .................. 346/135.1 X

*Primary Examiner*—Clifford D. Crowder
*Attorney, Agent, or Firm*—Herbert Dubno

[57] ABSTRACT

A printing process for producing a print film whose developed image can be transferred to an offset plate or a screen printing screen or even to a cathodically-charged plate, is made by scanning an original and laser writing under the control of the scanning signals on a light-sensitive layer through a diffusion foil. The latent image is then developed and fixed and the resulting film transferred to the printing carrier such as the offset plate or screen printing screen.

18 Claims, 2 Drawing Sheets

METHOD OF MAKING A PRINTING FILM AND PRINTING PROCESS USING SAME

FIELD OF THE INVENTION

My present invention relates to a method of making a printing film and to a printing method utilizing the film made by the improved process. The invention can be used for all printing processes, in principle, although most advantageously it is employed in the field of art-print printing and in other systems in which a very large number of color combinations and extremely high resolution is required or is advantageous.

BACKGROUND OF THE INVENTION

With present day standard printing processes, the original image must be converted into a raster pattern of some type with the raster pattern forming the print master. The resolution is a function of the resolution of the raster and, in many cases, the poor resolution resulting from the need for a raster, i.e. a dot pattern or like half-tone screen, results in poor rendition.

Because of the requirement for a raster or half-tone screen of this type, in offset printing, the various colors cannot be mixed at will. For each color, for example, a different angular setting of the raster is required.

With angular offsets between colors of less than 30°, moire patterns tend to be formed. This can be acceptable when, for example, only four colors are to be printed. However, in the case of art prints, so-called support colors must be printed together with other colors and it is difficult to provide the requisite angular offsets and to avoid color distortion, resolution failures and the like. By and large, therefore, offset art prints utilizing rasters or half-tone screens which must be angularly offset have relatively poor resolution.

OBJECTS OF THE INVENTION

It is the principal object of the present invention to provide an improved method of making a printing film, especially for use in the reproduction of works of art, i.e. in producing multicolor art prints, which will ensure high resolution in spite of the large number of colors which must be printed.

Another object of this invention is to provide an improved printing process whereby drawbacks of earlier printing processes are avoided.

Still another object of this invention is to provide high-resolution printing process which does not require the angular offsetting of a raster, dot pattern, half-tone screen or the like in producing the printing film.

SUMMARY OF THE INVENTION

These objects and others which will become apparent hereinafter are attained, in accordance with the invention, which eliminates the limitation to the geometric resolution provided by a raster pattern or half-tone screen.

According to the invention, based upon the original, an irregular roughness, not dependent on a half-tone screen, is imparted to the print carrier which is a function of the reproduced image and serves to pick up the color to a greater or lesser degree and transfer the color. This is attained, in accordance with the invention, by the use of a laser-reproduced print film.

According to the principles of the invention, the printing process comprises scanning an original with a scanner capable of continuous-tone scanning, controlling a laser beam with the scanner signal and directing the controlled laser beam in accordance with the pattern of the original onto a light-sensitive layer to produce a latent image of the original, whereby the laser beam before encountering the light-sensitive layer is caused to traverse a diffusion foil. The so-exposed film is developed and fixed in a conventional manner and transferred in a known manner to a print carrier such as an offset printing plate, a screen-printing screen or the like, e.g. by a photolithographic process.

More specifically, the printing method of the invention comprises the step of:

(a) continuous-tone scanning the original to produce electrical signals representing continuous-tone scanning of the original;

(b) directing a laser beam through a diffusion foil onto a light-sensitive laser of a film to expose the film and controlling the laser beam with the electrical signals to form a latent image of the original in the film;

(c) developing the latent image in the film to form a developed image and fixing the developed image;

(d) transferring the developed image to a printing master; and (e) printing a reproduction of the original With the printing master.

The printing film can be produced by the steps of:

(a) continuous-tone scanning the original to produce electrical signals representing half-tone scanning of the original;

(b) directing a laser beam through a diffusion foil onto a light-sensitive laser of a film to expos the film and controlling the laser beam with the electrical signals to form a latent image of the original in the film; and (c) developing the latent image in the film to form a developed image and fixing the developed image.

According to a feature of the invention, the developed image on the film is transferred in step (d) to an offset printing plate or a screen-printing carrier, i.e. a screen. Advantageously, the diffusion foil is placed on the light-sensitive layer for exposure thereof to the laser beam through the foil, the diffusion foil being held against the light-sensitive layer by subatmospheric pressure, i.e. suction, or by superatmospheric pressure, i.e. an air stream trained on the diffusion foil.

The light-sensitive layer and the diffusion foil ca be shaped, for exposure of the light-sensitive layer through the diffusion foil, into a drum configuration.

It has been found to be advantageous, moreover, to presensitize the light-sensitive layer to the laser beam by exposing it prior to step (b) to a threshold illumination. Threshold illumination presensitization techniques are known in the art.

Where the original is a multicolor original, steps (a)-(c) are repeated for each of a multiplicity of colors.

The diffusion foil can have a spreading angle of 5° to 30°, preferably 18°.

The principal advantage of the printing process of the invention is in maximizing the trueness of the original of the reproduction. Any desired color nuance can be printed even when, for example, 20 different color imprints must be superimposed. The resolution is about an order of magnitude or more greater than is the case with offset printing. The resolution can correspond to 200 to 400 image points per cm or 4,000 to 160,000 bits of image information per $cm^2$. Moire pattern formation need not be feared.

By contrast with earlier and conventional printing processes, the continuous-tone images which ar formed do not have to be transformed into a raster or have a raster superimposed upon them on the print carrier, for example, the offset printing plate or the screen of a screen-printing machine. The continuous-tone images generated by the laser are formed in a rasterless manner on the film and can be readily copied to any print carrier.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 3:
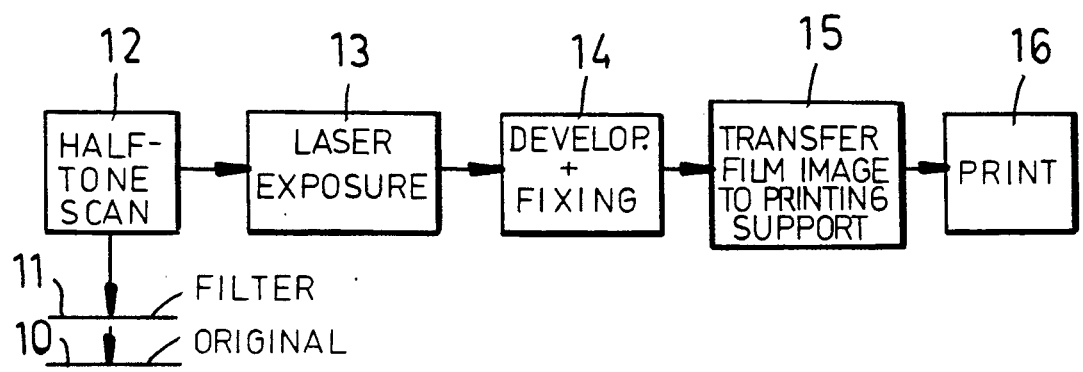
FIG. 3 is a block diagram illustrating the method of the invention.
Figure 4:
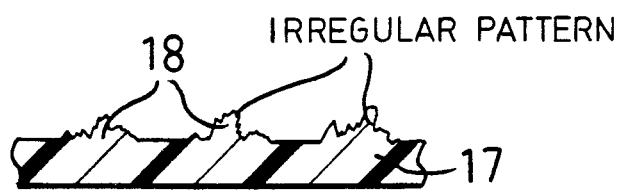
FIG. 4 is a diagram illustrating the irregularity pattern which is formed on the printing master resulting from the laser diffusion image formed on the photosensitive layer of the printing film.

Referring first to FIG. 3 in which the various steps of the process are outlined, it will be apparent that the initial step is a continuous-tone scan of an original 10, e.g. through a filter 11, the output from the continuous-tone scanner 12 being applied as the control signal for the laser exposure at 13 of the photosensitive or light-sensitive layer on the film through the diffusion foil. The film is then subjected to developing and fixing at 14 and the developed image from the film is transferred at 15 to a print carrier whereupon printing is carried out at 16 in the usual manner. The transfer to the print carrier, such as the offset plate or screen-printing master may use a photosensitive layer thereon which is exposed through the printing film, developed and fixed, in accordance with photolithographic, photo-offset and like principles.

The object of the laser exposure is to generate a pattern in the film which, when transferred to the print master 17, will produce surface irregularities 18 on which the printing ink can adhere to a greater or lesser extent and which are not in a standard raster pattern since no raster-type screen with regular geometry has been used in the process.

More specifically, the original pattern is detected in the scanner by scanning with a xenon lamp. The scanner must be capable of continuous-tone pickup. That means that the scanner applies a series of signals representing the half-tones without rastering of the original or any image.

The intensity of the picked-up beam of the scanner will vary with the intensity of the various pattern points of the original. For multicolor originals, the scanner produces a scan for each color, the color being selected by the filter 11. Four colors are standard for multicolor images. For monochrome reproductions, fewer colors may be scanned. Additional colors beyond the above-mentioned four ar normally scanned for art prints and the like. Half-tone scanners of the type described are known in the art.

Figure 1:
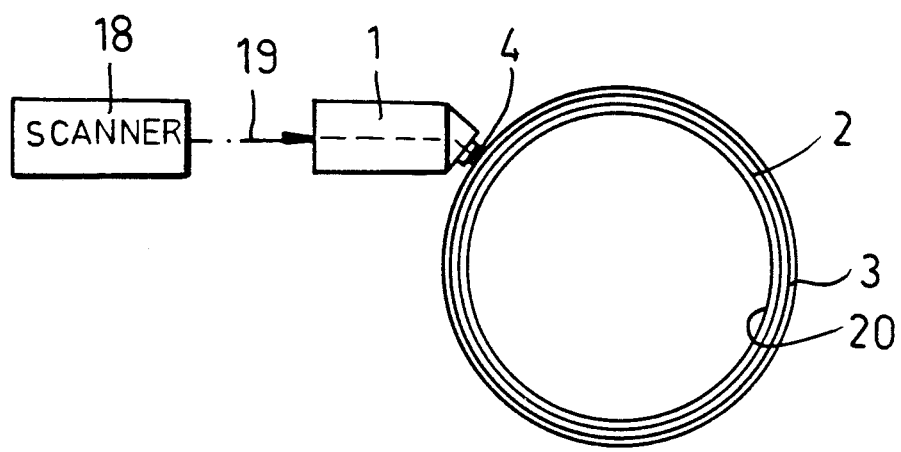
FIG. 1 is a diagrammatic end view of a drum showing the principles of the present invention.

Referring now to FIG. 1, it can be seen that an input from the scanner 18 is applied at 19 to a laser beam source 1 which trains its laser beam onto the light-sensitive layer 2 through a diffusion film as will be described. The film material carrying the light-sensitive layer 2 is shown at 20 in FIG. 1, both the light-sensitive layer and the diffusion film 3 lying therealong are seen to have been bent into a drum configuration. This laser writing step must be a high-resolution step, i.e. the beam cross section should be as small as possible. The film material which can be used may be so-called Lith film, a comparatively hard film.

Prior to the laser beam "writing," the Lith film is subjected, according to the invention, to a so-called threshold value exposure. This presensitizing exposure makes the film, "softer." The result is an increase in sensitivity of the film.

Figure 2:
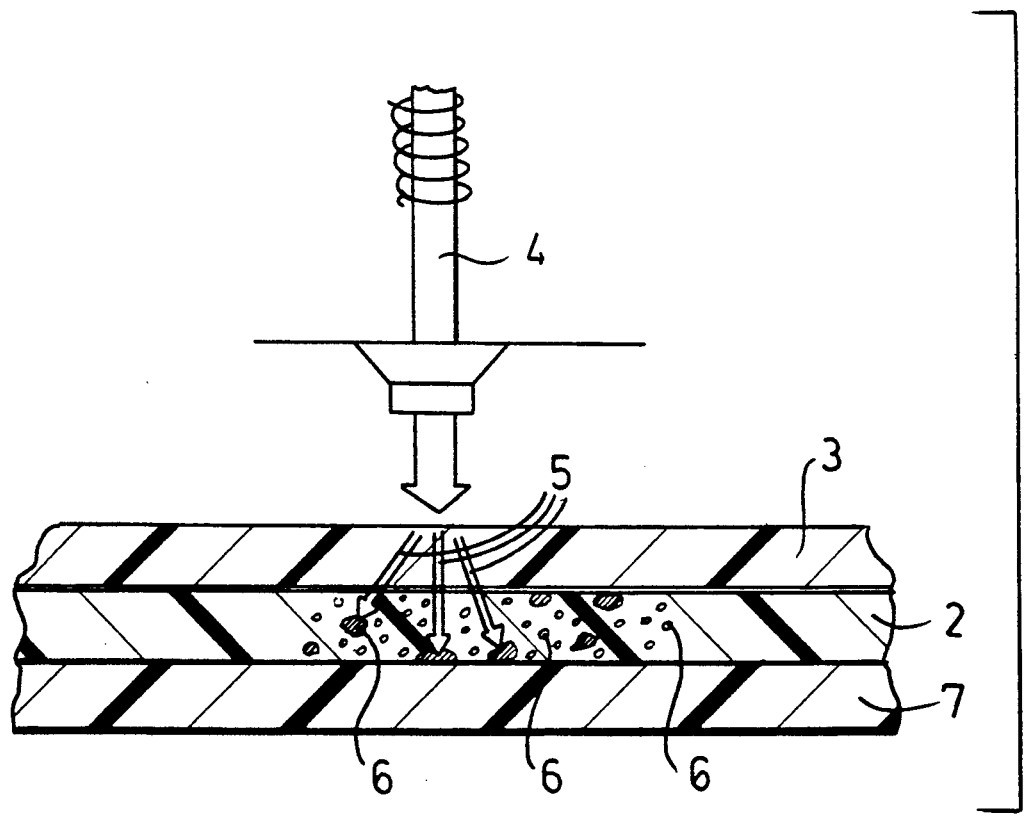
FIG. 2 is a cross section through a printing film in accordance with the invention illustrating the beam-spreading action of the diffusion foil.

As can be seen from FIG. 2, the laser beam from the Writing device is spread in the diffusion foil 3 (see partial beams 5) to activate silver halogen crystal 6 in the light-sensitive layer of the film. The film carrier is represented at 7 in FIG. 2.

During the writing operation, the intensity of the laser beam will vary in dependence upon the intensity of the particular color to which the scanner responds in the original. In the film layer only the ripest silver crystals will be activated.

Depending upon the intensity of the laser beam, more or fewer crystals will be activated resulting in a greater or lesser number of silver grains being formed. As a consequence, after the scanning of the entire original and writing with the laser beam in response to the continuous-tone scan, the Lith film carries a latent image representing the original. This latent image is then developed to make it visible and the nonilluminated material is washed away in the subsequent fixing.

The resulting developed image with a gray value approaches the gray value of the original and is free from geometric patterning of the type which arises from the use of a raster; rather there is a nonuniform distribution of the covered and noncovered parts of the film. In a conventional way, this film can be transferred to the print carrier, i.e. to the offset plate or to the master for screen printing or flexoprinting.

The diffusion foil serves to ensure a uniform resolution. If the diffusion foil is omitted, the developed image appears to be striped and has a hard black/white contrast which may be useful for some graphic effects but is not at all useful for the purposes of the invention.

Below I provide an example of the best mode currently known to me for carrying out the invention in practice.

For the production of the film, 1 use a Crosfield model 540S scanner which is equipped to function as a model 635S. Other scanning apparatus from other manufacturers can also be used as long as they possess the possibilities of the 635S Crosfield scanner.

Using this scanner, an original is scanned and the pattern of the original is transformed into pulses for the colors cyan, yellow, magenta and black, and are used to control the writing to provide four color overlays.

In the Crosfield scanner 635S, the exposure is effected using an argon laser beam with a modulator for varying intensity of the beam in accordance with the analyzed intensity of the picked-up color. The light is directed against the light-sensitive material. The writing density in this process is twice as fine as with a normal scanning process and corresponds to 400 lines per cm effected in an overlapping manner whereby for each scanning pass, the region up to the middle of the previous ring or exposed pass is scanned a second time. Between the laser beam source and the film to be exposed, I interpose a diffusion foil having a thickness of 0.10 mm having its smooth side toward the source of the laser beam and its mat side turned toward the film. The foil is laid onto the photosensitive layer. The spreading angle of a laser beam in this foil is 18°.

It has been found that good results are obtained with other angles of refraction as well. To ensure an optimum contact between the diffusion foil and the film material to be exposed, air between them can be sucked out by suction. With a vacuum of 80% of total vacuum between the film and the foil, the diffusion foil is retained without problems.

The light-sensitive film is subjected, prior to application of the diffusion foil, to a threshold value illumination in a contact copier. The light source is an iodine lamp operated at a voltage of 12 volts and 50 watts.

Sensitization is effected with a voltage reduced to 25%, a distance of 90 cm from light source to film and an exposure of 0.10 second. This film is then exposed in the scanner as described.

For the writing process in the scanner, I use preferably Lith film and the standard lith film development. Alternatively, Kodak Ultratec UCS film can be used with development by the Ultratec development system. Other systems can be employed as well, for example the Grandex system from Fuji or the "Agfastar" system from Agfa. The resulting film is copyable and can be used for the desired printing process.

For screen printing, flexo printing and book printing, an enlargement of the structure width may be necessary.

As mentioned, all scanners can be used which provide the requisite resolution, freedom from distortion and continuous-tone capabilities. Round scanners or flat scanners may be employed. The films of the invention can be utilized in all conventional color-printing modes, for example UCR (undercolor reduction), PCR utilizing the Küppers mode, etc. In these processes, electronics is used to reduce color portions or transform black parts.

For screen printing, the process of the invention has especially pronounced advantages. There is n need for a preangling on the screen and no color angling of the individual colors. For the printing of fabrics, for example, linen and silk, etc., no moire patterns tend to form since, according to the invention, no rasters are used.

It is also possible to enlarge the printing applications to analog electrostatic printing in which a cathode plate is statically charged and, utilizing the film in accordance with the invention corresponding to the rendition of a color pattern, is illuminated. The cathode plate, now carrying a latent image in the form of the electrostatic charge, can then be displaced over a liquid toner bath (Y=yellow, M=magenta, C=cyan and B=black) to pick up the corresponding cool pigments.

The process is repeated for each of the color patterns, Y, M, C, B, in the same manner to provide on the cathode plate a four-color image which can then be transferred to paper. The pigment is then thermally fixed to the paper. Printing in this manner can be an alternative to conventional offset printing.

I claim:

1. A printing process which comprises the steps of:
   (a) continuous-tone scanning the original to produce electrical signals representing half-tone scanning of said original;
   (b) directing a laser beam through a diffusion foil onto a light-sensitive layer of a film to expose said film and controlling said laser beam with said electrical signals to form a latent image of said original in said film;
   (c) developing said latent image in said film to form a developed image and fixing said developed image;
   (d) transferring said developed image to a printing master; and
   (e) printing a reproduction of said original with said printing master.

2. The printing process defined in claim 1 wherein said developed image is transferred in step (d) to an offset printing plate.

3. The printing process defined in claim 1 wherein said developed image is transferred in step (d) to a carrier.

4. The printing process defined in claim 1 wherein said diffusion foil is placed on said light-sensitive layer for exposure of said light-sensitive layer to said laser beam through said foil.

5. The printing process defined in claim 4, further comprising holding said diffusion foil against said light-sensitive layer for exposure of said light-sensitive layer to said laser beam through said foil.

6. The printing process defined in claim 5 wherein said diffusion foil is held by subatmospheric pressure against said light-sensitive layer.

7. The printing process defined in claim 5 wherein said diffusion foil is held by superatmospheric pressure against said light-sensitive layer.

8. The printing process defined in claim 4 wherein said light-sensitive layer and said diffusion foil are shaped into a drum configuration.

9. The printing process defined in claim 1, further comprising the step of presensitizing said light-sensitive layer to said laser beam by exposing said light-sensitive layer prior to step (b) to a threshold illumination.

10. The printing process defined in claim 1 wherein said original is a multicolor original, further comprising carrying out steps (a) to (c) for each of a multiplicity of colors of said original and transferring each of the developed images thus obtained to printing master.

11. The printing process defined in claim 1 wherein said diffusion foil has a spreading angle for said laser beam of 5° to 30°.

12. The printing process defined in claim 11 wherein said spreading angle is 18°.

13. A method of producing a printing film comprising the steps of:
    (a) continuous-tone scanning an original to produce electrical signals representing half-tone scanning of said original;
    (b) directing a laser beam through a diffusion foil onto a light-sensitive layer of a film to expose said film and controlling said laser beam with said electrical signals to form a latent image of said original in said film; and
    (c) developing said latent image in said film to form a developed image and fixing said developed image.

14. A method of producing a printing film defined in claim 13 wherein said light-sensitive layer and said diffusion foil are shaped into a drum configuration.

15. The method of producing a printing film defined in claim 13, further comprising the step of presensitizing said light-sensitive layer to said laser beam by exposing said light-sensitive layer prior to step (b) to a threshold illumination.

16. The method defined in claim 13 wherein said original is a multicolor original, further comprising carrying out steps (a) to (c) for each of a multiplicity of colors of said original and transferring each of the developed images thus obtained to a printing master.

17. The method defined in claim 13 wherein said diffusion foil has a spreading angle for said laser beam of 5° to 30°.

18. The method defined in claim 17 wherein said spreading angle is 18°.

* * * * *